(12) United States Patent
Lee et al.

(10) Patent No.: US 7,741,633 B2
(45) Date of Patent: Jun. 22, 2010

(54) FERROELECTRIC OXIDE ARTIFICIAL LATTICE, METHOD FOR FABRICATING THE SAME AND FERROELECTRIC STORAGE MEDIUM FOR ULTRAHIGH DENSITY DATA STORAGE DEVICE

(75) Inventors: Jaichan Lee, Seoul (KR); Taekjib Choi, Gyonggi-do (KR)

(73) Assignee: Sungkyunkwan University Foundation For Corporate Collaboration, Suwon-si (KR)

( * ) Notice: Subject to any disclaimer, the term of this patent is extended or adjusted under 35 U.S.C. 154(b) by 777 days.

(21) Appl. No.: 11/420,544

(22) Filed: May 26, 2006

(65) Prior Publication Data
US 2007/0152253 A1 Jul. 5, 2007

(30) Foreign Application Priority Data
Dec. 31, 2005 (KR) .................. 10-2005-0136245
May 19, 2006 (KR) .................. 10-2006-0045081

(51) Int. Cl.
*H01L 31/00* (2006.01)

(52) U.S. Cl. ................. 257/20; 257/759; 257/760

(58) Field of Classification Search .......... 257/20, 257/758–760
See application file for complete search history.

(56) References Cited

U.S. PATENT DOCUMENTS
6,747,357 B2    6/2004    Lee et al.

FOREIGN PATENT DOCUMENTS
KR    1020030070295    *    3/2003
KR    1020030070295         8/2003

OTHER PUBLICATIONS

Cho, Yasuo et al, "Realization of 10 Tbit/in.2 memory density and subnanosecond domain switching time in ferroelectric data storage", Applied Physics Letters, Dec. 2, 2005.
Paurch, P. et al, "Nanoscale control of ferroelectric polarization and domain size in epitaxial Pb(Zr 0.2Ti0.8)O3 thin films", Applied Physics Letters, Jul. 23, 2001, pp. 530-532.

* cited by examiner

*Primary Examiner*—Leonardo Andújar
(74) *Attorney, Agent, or Firm*—Schmeiser, Olsen & Watts LLP

(57) ABSTRACT

The present invention is related to a ferroelectric storage medium for ultrahigh density data storage device and a method for fabricating the same. A supercell having high anisotropy is formed by controlling crystal structure and symmetry of unit structure (supercell) of artificial lattice by using an ordered alignment of predetermined ions having orientation of (perpendicular) deposition direction. Unit atomic layers of oxides having different polarization characteristic are deposited so that the supercell itself shows electric polarization having only two, upward and downward directions as one block of supercell having single-directional polarization. Oxide artificial lattices can be formed so as to have solely 180 degree domain structure, thus a single electric domain having improved anisotropic characteristic can be formed, thereby allowing capability of ultrahigh density data storage and long term data retention.

7 Claims, 7 Drawing Sheets

FERROELECTRIC OXIDE ARTIFICIAL LATTICE, METHOD FOR FABRICATING THE SAME AND FERROELECTRIC STORAGE MEDIUM FOR ULTRAHIGH DENSITY DATA STORAGE DEVICE

FIELD OF THE INVENTION

The present invention relates to a ferroelectric storage medium for an ultrahigh density data storage device and a method for fabricating the same. More specifically, the present invention is related to a ferroelectric storage medium and a method for fabricating the same, wherein a supercell having high anisotropy feature is formed by controlling the crystal structure and symmetry of a unit structure (supercell) of an artificial lattice by sequentially depositing oxide in unit atomic layers having different polarization characteristic so as to orderly align predetermined ions in the artificial lattice into their deposited (perpendicular) direction, so that the supercell itself shows electric polarization having only two upward and downward directions as one block of the supercell showing single-directional polarization, and wherein the artificial oxide lattice comprising the supercell block is fabricated to have solely 180 degree domain structure leading to nano-scaled domains capable of increasing data storage density in probe type data storage device.

BACKGROUND OF THE INVENTION

Recently, with the change into a knowledge-based society, where information resources are important, and the increase in data volume used by individuals, the need for data storage devices has been ever increasing. Also, with the rapid development and the increasing demand in fields such as large volume data storage devices, information appliance devices, personal portable information devices, and digital image devices, requiring data storage, the demand for ultra small, high density nonvolatile data storage media is increasing. Conventional hard disks have difficulties in miniaturization and are less feasible in high density integration due to their limitations due to the ultra-paramagnetic feature, which is a unstable data stage caused by thermal energy. Meanwhile, at present, with flash memories, it is difficult for the integration density to reach the data storage capacity of hard disks, and CDs and DVDs representing optical data storage devices can not overcome their limitation due to the light wavelength, which is required in response to a high degree of integration. Thus, as an alternative, recently, various kinds of scanning probe type data storage devices and storage media are being studied. Scanning probe type data storage devices are meant by devices utilizing Atomic Force Microscopes (AFM), which use forces between atoms, and Scanning Probe Microscopes (SPM) such as Scanning Tunneling Microscopes (STM).

For the Scanning Probe Microscope type data storage devices, studies have been made concerning thermal recording type polymers, magnetic recording type ferromagnetic materials, organic thin films or phase transition materials using change of electric conductivity according to phase transition, and static electric force type ferroelectric media using surface charge change, as data storage media. As methods for writing/reading such a storage medium, one method is the use of electrical/magnetic forces, which forms domains through reversal of electric/magnetic polarization of ferroelectric or ferromagnetic material by applying an external electric/magnetic field on a scanning probe, and another method is a thermal method, that is, the forming of well-shaped deformations or changing the electric conductivity on the surface of a polymer by applying heat on the storage medium through a probe. The method of thermal writing/reading is disadvantageous in that it has a low speed of operation, a limited number of times that the writing can be repeated, and high power consumption. Also, the method of electric conductivity change is disadvantageous due to the oxidation of the storage medium and abrasion of the probe.

Thus, as a method for overcoming such problems and disadvantages, the use of ferroelectric storage media is being actively studied. The principle of writing a data storage medium by using a ferroelectric storage medium is as follows. A probe, instead of an upper electrode, contacts the ferroelectric storage medium, which is formed on a lower electrode, so as to form a capacitor structure. Then, by applying an external voltage on the probe, the electric polarization of the ferroelectric thin film is changed toward the direction of the electric field. Thus, by placing the probe on a predetermined point of the surface of the ferroelectric thin film, and by applying a voltage on this point, a domain (data bit) can be formed by arranging electric polarization of a ferroelectric material into a predetermined direction, enabling a data write operation. Also, if an AC voltage having uniform frequency is applied between the probe and the lower electrode, the amplitude of the ferroelectric thin film is changed by the electric force among the electric polarization of the ferroelectric material in accordance with the applied AC voltage, and thus such change of the amplitude changes the minute force between the probe and the ferroelectric thin films, and the magnitude of such change differs according to the direction of the domain. Therefore, data can be read by analyzing it. If a ferroelectric thin film is used for a storage medium, it will have advantages of high speed of data read/write, low power consumption, and ability of repeated writing. However, there is much to be done for solving the problems of this technology.

At present, as ferroelectric materials, peroveskite oxides having the crystal structure of $ABO_3$ are being studied. The representing materials thereof include $BaTiO_3$, $(Pb,Zr)TiO_3$ (PZT), and $LiTaO_3$. The peroveskite oxide having the crystal structure of $ABO_3$ has an isotropic cubic crystal structure showing the six directional electric polarizations upward, downward, leftward, rightward, frontward and backward by minute displacement of ions in the peroveskite oxide. Therefore, eventually its electric polarizations are displaced to have 90 degree directional differences with each other. Therefore, it has a 90 degree domain structure. Such 90 degree domain structure generates mechanical strains between 90 degree domains and makes its electric polarization unstable, and as a result, it has been difficult to fabricate a ferroelectric storage medium including the 90 degree domain structure in nanoscale as a unit bit for data storage. Also, if the electric polarization has a 90 degree domain structure, the long term stability of electric polarization in the domain will be decreased due to strains therebetween, so the remaining polarization in the structure becomes gradually decreased, which would result in disappearance of long term ability of data storage and errors in read operation of the stored data. That has been the great obstacle in industrialization of the ferroelectric data storage medium. Furthermore, as a thin film type storage medium is fabricated in nano-scale thickness, its electric polarization becomes unstable due to the finite size effect, lowering stability of the storage medium.

Recently, it was reported that at least a 20 nm scale bit can be produced by uniformly arranging the direction of polarization in the material through epitaxial growth of a PZT thin film, being capable of storing tens of $Gbit/cm^2$ data (Applied Physics Letters, P. Paruch et al., Vol 79, 530 (2001)). However, there is a difficulty in forming a bit because poly domains including 90 degree domains can be easily formed due to lattice strains between a substrate and a thin film during the epitaxial growth of the PZT thin film. Also, it requires a process for fabricating a thin film in atomic scale with a high degree of surface flatness, and thus it still has a problem of retaining time in data storage.

In one effort to overcome the above problems, Cho group in Japan recently reported that an at least 8 nm scale bit with very small thickness, which enables 10 Tbit/inch$^2$ of data storing ability when analyzed by a Scanning Nonlinear Dielectric Microscope (SNDM), is formed from a layer of $LiTaO_3$ single crystals by using mechanical chemical polishing. However, this technology (mechanical chemical polishing) requires a very delicate process of fabricating single crystals into a very thin layer.

SUMMARY OF INVENTION

Accordingly, the object of the present invention is to overcome the problems of the above mentioned ferroelectric thin films by growing an oxide artificial lattice of atomic unit thickness by layer-by-layer growth. The object of the present invention is also to provide a ferroelectric storage medium for an ultrahigh density data storage device and a method for fabricating the same, which is formed by carrying out a process of stacking oxide layer with unit atomic thickness layer-by-layer so as to form a new conceptual artificial unit lattice (supercell) having high anisotropy, in which the direction of electric polarization in the lattice, only upward and downward, is oriented into the stacking direction and thus the artificial lattice, has only a 180 degree domain structure, being capable of domain size formed in nano-scale, which can be a unit for data storage, and of greatly improved retention characteristic, allowing an improvement of the read/write speed of data storage from the improved surface flatness.

The present invention, which accomplishes the above object, provides an oxide artificial lattice having an improved surface flatness grown by expitaxy method and a sole 180 degree domain structure, which can show electric polarization similar to that of the conventional PZT thin film, in which the conventional ferroelectric PZT thin film is replaced with the artificial lattice that is artificially formed by periodically stacking dielectric material such as $PbZrO_3$ and $PbTiO_3$ having different electric polarization characteristics.

Also, the present invention provides a storage medium, comprising: a single crystalline substrate, an electrode being formed on the substrate, and a ferroelectric oxide artificial lattice being fabricated on the electrode. The artificial lattice is fabricated by stacking each layer of at least two or more oxide (ferroelectric) dielectric materials with unit lattice thickness having polarization characteristics different from each other within the range from one unit lattice thickness to a plurality of unit lattice thicknesses so as to have a predetermined alignment of electric polarization, thereby forming a structure having an anisotropic characteristic, wherein the unit lattice (supercell), which does not exist in the natural world, is newly defined/fabricated so that the electric polarization of the supercell is directed only in the upward and downward directions with regard to the thin film. A very thin film comprising the supercell block having the above characteristic is repeatedly stacked at least one time, thereby forming one artificial lattice having only a 180 degree domain structure.

Meanwhile, for the (ferroelectric) dielectric materials, any dielectric material showing ferroelectric characteristics, when each atomic unit layer thereof is periodically stacked, can be used. Even if the dielectric material does not have spontaneous electric polarization, if a supercell is formed with this material, the artificial lattice can display ferroelectric properties having electric polarization. Specifically, the (ferroelectric) dielectric material is preferably any one selected from the group consisting of $PbTiO_3$, $PbZrO_3$, $BaZrO_3$, $SrTiO_3$, $SrZrO_3$, $KNbO_3$, $KTaO_3$, $CaTiO_3$, $CaZrO_3$, $BaSnO_3$, and $BaFeO_3$, having a peroveskite structure. More preferably, the (ferroelectric) dielectric material is $PbZrO_3$ or $PbTiO_3$ having a peroveskite structure. Preferably, the stacked layers in the supercell fabricated from the (ferroelectric) dielectric materials are set to range from each peroveskite unit lattice layer thickness to 5 unit lattice layer thicknesses. The new conceptual supercell (unit lattice of artificial lattices) according to the present invention is suitable to be referred as an artificial supercell when the stacked thicknesses of each peroveskite material in the supercell is very thin so as to be within a few unit lattices. If the stacked thicknesses in the supercell becomes thick, for example, if $PbZrO_3$ or $PbTiO_3$ becomes thick so as to have 10 unit lattice layers, respectively, the resulting material formed from such supercell would be not considered as an oxide artificial lattice, but multi-layer oxide thin films of $PbZrO_3/PbTiO_3$, which comprise multi layers of a distinctive $PbZrO_3$ layer and a $PbTiO_3$ layer, each having 4 nm lattice thickness. The oxide artificial lattice is not such a multi-layer oxide comprising different distinctive oxide layers, but the material obtained by artificially aligning each ion in the supercell based on two dimensional growth technology of each unit lattice layer and repeatedly stacking the layers. The present invention creating a new functional material through the newly defined supercell is distinctive from the conventional multi-layer oxide in that a ferroelectric storage medium having the nano-scaled domain and a physical improvement over the conventional technology can be provided. The dielectric thin film can be manufactured by any one of the following methods: a pulsed laser deposition method, a molecule beam epitaxy method, a chemical vapor deposition method, and a physical vapor deposition method.

Specifically, the manufacturing process for the dielectric thin film by using the pulsed laser deposition method is as follows. A deposition temperature is set in a range of 400 to 600 degrees Celsius while raising the deposition temperature by 10 degrees Celsius per minute. A partial pressure of oxygen is maintained in a predetermined range of 1 mTorr to 300 mTorr, thereby forming a process atmosphere. The substrate is rotated at a predetermined speed within a range of 10 to 12 rpm. A laser having 248 nm of wavelength and 30 ns of pulse is focused in a size of 6×2 mm using KrF gas as a laser source, and targets of $PbZrO_3$ and $PbTiO_3$ having 99.9% purity are inputted into the substrate, setting a power intensity of the laser of 2 J/cm$^2$. The deposition process is performed by radiating the laser to the targets at a rate of 1 pulse/sec, setting a deposition speed of the $PbZrO_3$ and $PbTiO_3$ layers in a range of 7 to 9 pulses/1 unit lattice and 6 to 8 pulses/1 unit lattice, respectively. The temperature of the chamber is lowered by 8 to 12 degrees Celsius per minute while maintaining the partial pressure of oxygen in the chamber at 400 Torr, after forming the artificial lattice by using $PbZrO_3$ and $PbTiO_3$.

BRIEF DESCRIPTION OF THE DRAWINGS

The accompanying drawings, which are included to aid in understanding the invention and are incorporated into and constitute a part of this application, illustrate embodiment(s) of the invention and together with the description serve to explain the principles of the invention. In the drawings.

DETAILED DESCRIPTION OF INVENTION

Hereinafter, the preferred embodiments according to the present invention will be described with reference to the accompanying drawings.

Figure 1:
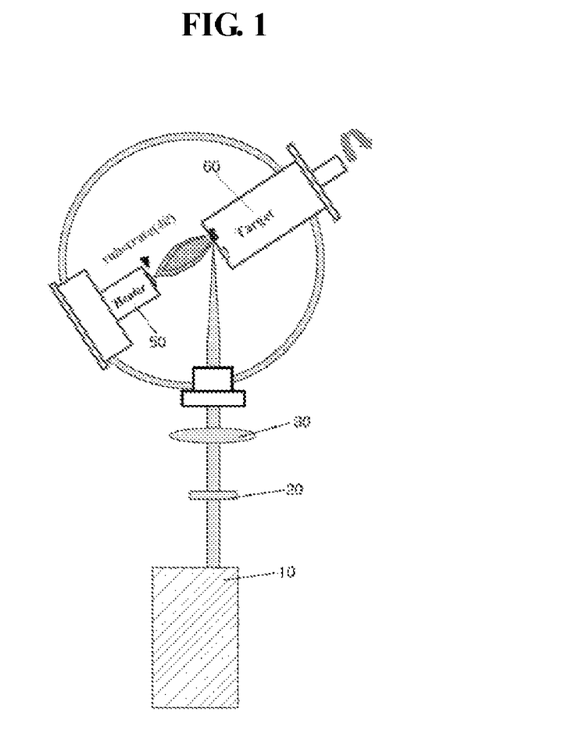
FIG. 1 is a schematic view of a PLD system used for forming the oxide artificial lattice of the ferroelectric storage medium according to the present invention.

FIG. 1 is a schematic view of a Pulsed Laser Deposition (PLD) system used for forming a multi-layered oxide artificial lattice of ferroelectric thin film according to one embodiment of the present invention. Referring to FIG. 1, the PLD system comprises an excimer laser 10, an attenuator 20, a focusing lens 30, a target substrate 40 formed with a bottom electrode, and a heater 50. KrF gas is used as a laser source and the excimer laser is a COMPEX 205 excimer laser available from Lambda Physics Company which has a wavelength of 248 nm and generates 30 ns of pulse. $PbZrO_3$ and $PbTiO_3$ targets having 99.9% purity are used as the target 60. The attenuator 20 includes silica glass for controlling the laser energy. Then, the focusing lens 30 is adjusted so that the laser incident into a vacuum chamber has a size of 6 mm×1 mm at the target substrate 40. The power density of the laser is determined as 2 J/cm².

The pulsed laser deposition (hereinafter, simply referred to PLD) method will be simply described below. The PLD method is a kind of thermal plasma deposition method, which can obtain a relatively large energy per unit area by focusing the pulse generated from the laser through an optical lens. If the focusing laser pulse incident into the vacuum chamber is applied to the target having a predetermined chemical composition, the materials making up the target absorb the laser beam, so a thermal evaporation is momentarily generated while creating the plasma. The film is deposited by using the created plasma. Generally, the generated laser has a short time pulse within tens of nano seconds (ns). The target is subject to a thermal circulation for one pulse period, in which the target is heated and cooled during one pulse period. The materials making up the target are evaporated while the thermal circulation is carried out, so that the thin film can be deposited. The pulsed laser deposition method can deposit the thin film regardless of what kind of gas, active gas or inert gas, is to be used in the vacuum deposition process, capable of creating many atoms to be deposited within a short time period. In addition, though the target has various compositions, it is possible to deposit the film having the compositions identical to the compositions of the target. For material having a high melting point, if the material itself can strongly absorb the laser, the deposition of film is possible. In addition, it is not required to add ions during the deposition process, and a heater for heating the material and a device for charging the plasma are not required, so the film can be deposited even in a high-pressure condition. On the other hand, since relatively large particles are generated from the target while the deposition process is being carried out, the surface of the film could become rough, so the uniformity is lowered when the film is deposited, so that the uniform deposition area is reduced, relatively. Examples of parameters affecting the deposition of the film are the temperature of the substrate, the power of the laser, the wavelength of the laser, the pulse period of the laser, the partial pressure of gas and the distance between the substrate and the target. In the present embodiment, though the dielectric material is deposited by using the pulsed laser deposition process, it is also possible to deposit the dielectric material by using any one selected from the group consisting of a molecule beam epitaxial process, a chemical vapor deposition process, and a physical vapor deposition process.

Figure 2A:
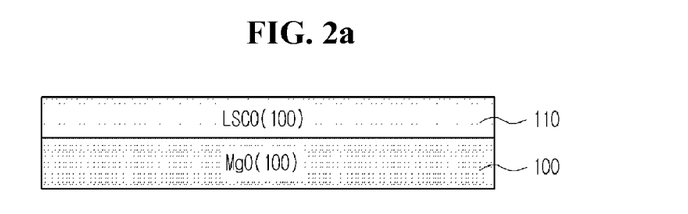
FIGS. 2a to 2c are sectional views showing process steps for manufacturing the oxide artificial lattice of ferroelectric storage medium according to the present invention.
Figure 2B:
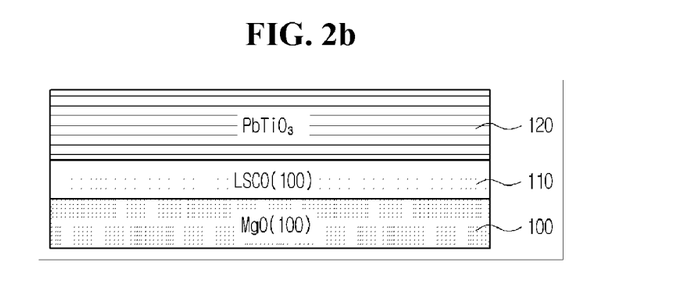
Figure 2C:
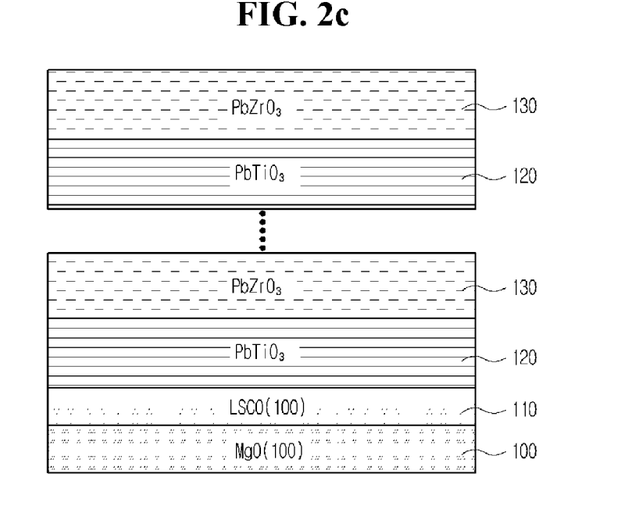

FIGS. 2a to 2c are sectional views showing process steps for manufacturing the oxide artificial lattice according to one embodiment of the present invention by using the PLD apparatus. Referring to FIG. 2a, by using acetone, methanol and tetraethyl chloride (TEC), an MgO substrate 100 is subject to an ultrasonic cleaning process for 5 minutes and dried by using nitrogen. Then, the MgO substrate 100 is attached to a heater 40 by means of silver paste, so that the MgO substrate 100 is dried. After that, by using the pulsed laser deposition process (PLD-248 nm krF excimer laser), a bottom electrode (La,Sr)CoO₃ (LSCO) 110 is formed on the MgO single crystalline substrate 100. Then, as shown in FIGS. 2b and 2c, the incident laser is applied to the target being rotated, so that the film is deposited. At this time, two targets are simultaneously installed to deposit a PTO ($PbTiO_3$) layer 120 and a PZO ($PbZrO_3$) layer 130 each having a predetermined thickness. The rotating speed of the target 60 is 11 rpm. In addition, the deposition temperature is set at about 500 degrees Celsius, the deposition temperature being raised by 10 degrees Celsius per minute and the partial pressure of oxygen is maintained at 100 mTorr. The deposition speed of the PZO layer and the PTO layer is 8 pulses/1 unit lattice and 7 pulses/1 unit lattice, respectively. The laser is incident on the target at a rate of 1 pulse/second.

According to the present invention, the period of the PZO/PTO artificial lattice varies between $PZO_1$ unit lattice/$PTO_1$ unit lattice (simply referred to $PZO_1/PTO_1$, 1 unit lattice is approximately 0.4 nm), $PZO_2/PTO_2$, $PZO_5/PTO_5$, $PZO_{10}/PTO_{10}$, $PZO_{25}/PTO_{25}$, $PZO_{50}/PTO_{50}$, and $PZO_{100}/PTO_{100}$. That is, $PZO_1/PTO_1$ means that the PZO and PTO are repeatedly deposited with a thickness of about 0.4 nm. Here, the period is obtained by adding a unit lattice of PZO to a unit lattice of PTO, which means a lattice constant of a new artificial lattice, which does not exist in nature. Accordingly, if the film is deposited with a thickness of 80 nm, each PZO and PTO is deposited 100 times, so 200 layers are formed.

Therefore, in case of $PZO_{10}/PTO_{10}$, this is a result formed by 10 times depositing a unit lattice layer comprising one PZO layer and one PTO layer. After depositing the PZO and PTO artificial lattice, the temperature in the vacuum chamber is lowered to room temperature by decreasing the temperature by 15 degrees Celsius per minute. At this time, the partial pressure of oxygen in the chamber is maintained at 400 Torr. Here, the deposition thickness of the artificial lattices and its entire thickness are not limited to the embodiment of the present invention. Also, the above dielectric material is not limited to $ABO_3$ oxide having peroveskite structure. Other (ferroelectric) dielectric materials having crystal structure other than the above crystal structure can be used, if an artificial lattice can be formed by repeatedly depositing dielectric materials having polarization characteristics different from each other and if it has a 180 degrees domain structure and shows ferroelectric properties, so it can be used as a data storage medium.

Figure 3:
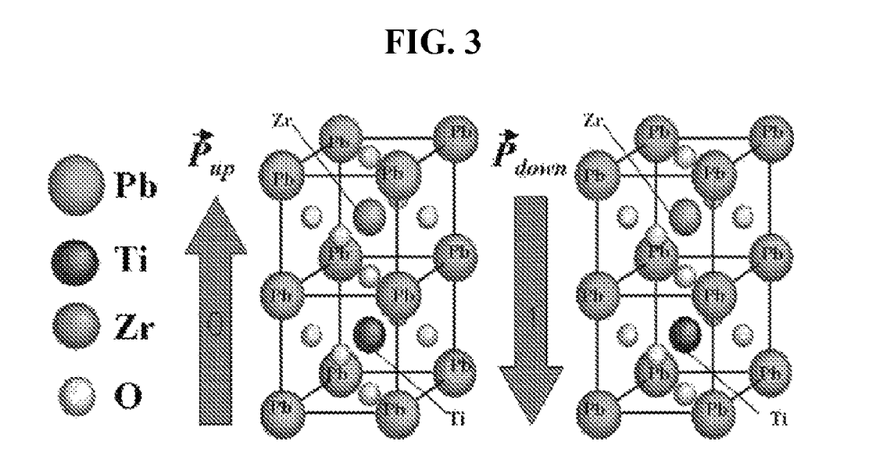
FIG. 3 is a view showing the $PbZrO_3/PbTiO_3$ artificial lattice structure according to the present invention and its 0 and 1 states of storing data according to the directions of electric polarization.

FIG. 3 is a cross sectional view showing the artificial lattice fabricated by the above processes. Referring to FIG. 3, the $PbZrO_3/PbTiO_3$ artificial lattice of the above embodiment has a layer-by-layer (LBL) structure, in which Ti atoms and Zr atoms are aligned in an ordered manner. Typical $Pb(Zr, Ti)O_3$ (PZT) solid solution has a structure in which Ti atoms and Zr atoms are randomly positioned, and its unit cell is slightly changed from a cubic structure having isotropic structure thereby showing electric polarization. Such electric polarization has the 6 directional orientations upward, downward, leftward, rightward, frontward and backward orientations, thereby generating a 90 degrees domain structure. To the contrary, as shown in FIG. 3, the present invention enables fabrication of a unit structure having ordered alignment of layers sequentially comprising Pb—O layer, Ti—O layer, Pb—O layer, and Zr—O layer, and again Pb—O layer and so on by depositing unit atomic layer or unit lattice layer of oxide with layer-by-layer growth. This unit structure is called a supercell, in which a Ti—O layer and a Zr—O layer are formed so that each layer is repeated in order. Contrary to the conventional PZT unit cell, in which Ti atoms and Zr atoms are positioned randomly thereby showing an isotropic characteristic, the supercell according to the present invention has an anisotropic characteristic, thus its electric polarization shows the two directional orientations upward and downward. Since the supercell, which is a unit structure of oxide artificial lattices, has the above characteristic, the oxide artificial lattice formed by repeatedly depositing the supercell structure, does not have a 90 degrees electric domain. That affects the polarization of the ferroelectric material and production, size, stability of domain, and shows a domain structure solely consisting of 180 degrees domains. Contrary to the 90 degrees electric domain, the 180 degrees electric domain does not generate strains in the material, thereby enabling a nano-scaled electric domain having long-term retention. Furthermore, since a voltage, which can reverse the electric domain, is applied on the upper portion of the storage medium and the direction of electric polarization of the anisotropic supercell is perpendicular to the substrate, the polarization reversal can be done in a perpendicular manner. Since such polarization reversal can be used as a data storing unit, "0" and "1", polarization to be used for a data storing signal can be increased and an ultrahigh density of data storage can be obtained.

In the present invention, for (ferroelectric) dielectric materials having different polarization characteristic, $PbTiO_3$, $PbZrO_3$, $BaZrO_3$, $SrTiO_3$, $SrZrO_3$, $KNbO_3$, $KTaO_3$, $CaTiO_3$, $CaZrO_3$, $BaSnO_3$, and $BaFeO_3$ having peroveskite structure can be used in forming the supercell. Some of the above materials, e.g., $CaTiO_3$, do not show electric polarization spontaneously, but they can be used in forming the supercell. For example, when fabricating an artificial lattice by using $PbTiO_3$ and $CaTiO_3$ in a supercell, since $PbTiO_3$ and $CaTiO_3$ have polarization characteristics different from each other, a supercell having an ordered alignment of atomic Ca and Pb can show electric polarization. Namely, although $PbTiO_3$ single material has electric polarization and $CaTiO_3$ single material does not have electric polarization, a $PbTiO_3/CaTiO_3$ artificial lattice having a newly fabricated supercell can show physical properties different from the respective single materials thereby showing electric polarization.

As one embodiment of the present invention, for an artificial lattice using $PbTiO_3/PbZrO_3$, since $PbZrO_3$ is an antiferroelectric material, whose electric dipoles is aligned in the opposite direction with each other in the materials, the material does not have electric polarization as a whole. However, by aligning Ti and Zr in orders in a supercell of an artificial lattice, the artificial lattice can show electric polarization. Furthermore, the anisotropic characteristic of such electric polarization enables a nano-scaled electric domain having long-term retention.

According to the present invention, in order to improve surface flatness, which is one of the important factors for application in the area of ferroelectric storage media, two dimensional growth technology growing unit lattice layers of distinct materials with uniform thickness with layer-by-layer growth on a substrate, is used for fabricating artificial lattices. The supercell is fabricated by aligning atoms on predetermined lattice positions when depositing unit lattices of oxide with layer-by-layer growth based on the two dimensional growth technology, and the oxide artificial lattice is fabricated by repeatedly stacking supercells.

In order to inspect the crystal structure of the artificial lattice with multi-layer films, an X-ray diffractometry (XRD) having Cu-Ka wavelength (lambda=1.5405 Angstrom) is used. In addition, the electrical characteristic is measured by using an RT66A ferroelectric polarization characteristic analyzer and an LCR analyzer (HP4194A Impedance Analyzer). Surface flatness, domain structure and nano scale bit formation of the artificial lattice are measured by using scanning probe microscopy. Especially, surface flatness is measured by scanning the surface of the artificial lattice by using contact mode atomic force microscopy. In this atomic force microscopy, orientation of the electric polarization in the artificial lattice is re-aligned into a predetermined direction by applying an outer pulse or a DC voltage on a probe and the data reflecting such re-alignment is recorded. When recording the data, piezoresponse force microscopy, which analyzes and measures electric polarization orientations from amplitude change of a thin film by the force between domains recorded in the thin film in response to a uniform AC voltage applied on a probe contacting the thin film, is used.

Figure 4:
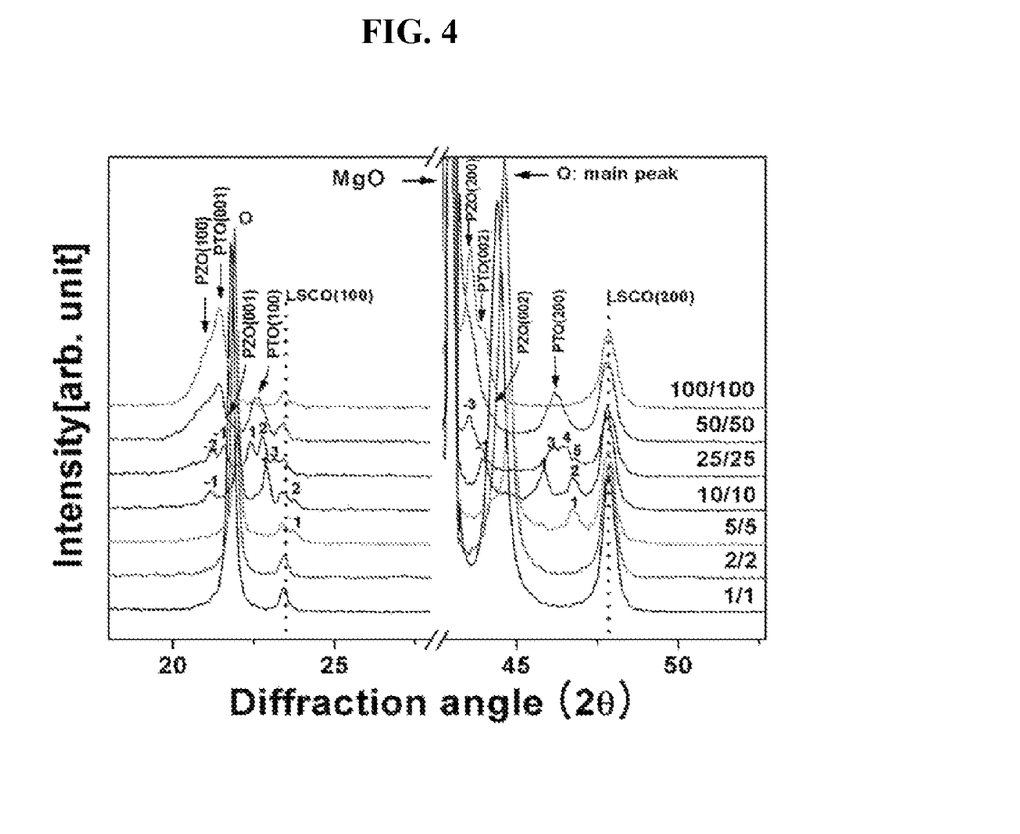
FIG. 4 is a graph showing an XRD pattern result according to the variation of the periodicity of the PZO/PTO artificial lattice deposited on LSCO/MgO substrate.

FIG. 4 is a graph showing an XRD pattern result according to the variation of the deposition thickness of the PZO/PTO artificial lattice deposited on the LSCO/MgO substrate. Referring to FIG. 4, the PZO/PTO artificial lattice is deposited by varying the deposition thickness of the PZO/PTO artificial lattice between $PZO_1/PTO_1$, $PZO_2/PTO_2$, $PZO_5/PTO_5$, $PZO_{10}/PTO_{10}$, $PZO_{25}/PTO_{25}$, $PZO_{50}/PTO_{50}$, and $PZO_{100}/PTO_{100}$ under the same process condition. Here, a transverse direction of the graph is a diffraction angle (2 theta) between X-rays incident on a sample and X-rays scattered by making contact with a crystal of a film of the PZO/PTO artificial lattice, and a longitudinal direction of the graph is the intensity of the scattered X-rays.

As shown in the graph of FIG. 4, the peaks shown at angles of 43 and 48 degrees represent the directional features of the MgO(200) substrate and lower electrode LSCO(200), respectively. In addition, each PZO/PTO artificial lattice film is deposited and grown in the direction identical to the direction of the MgO substrate. The peaks shown near the angles of 21.9 and 45.7 degrees are main peaks representing a mean face-to-face distance between PZO and PTO layers. Satellite peaks representing the characteristic of the artificial lattice are shown at both sides of the main peak. In samples above $PZO_{25}/PTO_{25}$, where the periodicity exceeds a critical thickness, the coherence cannot be maintained at the interfacial surface between the PZO and PTO layer so that the main peak disappears. In samples of $PZO_{50}/PTO_{50}$ and $PZO_{100}/PTO_{100}$, the diffraction peak of each PZO and PTO layer is represented. The diffraction pattern of the PZO/PTO artificial lattice film is grown on the MgO single crystalline substrate in the c-axis direction, and satellite peaks representing the characteristic of the artificial lattice are detected. Thus, it can be shown that the PZO/PTO artificial lattice has a new concept of supercell structure according to the periodicity.

Figure 5:
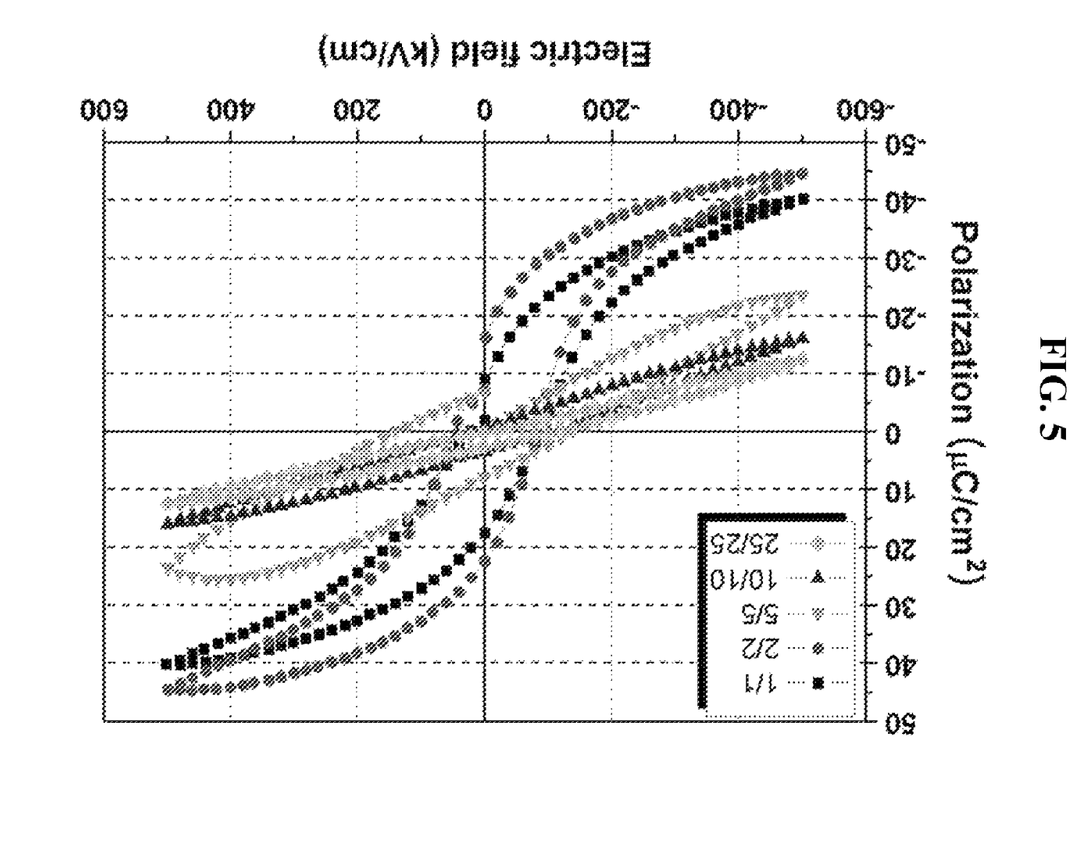
FIG. 5 is a graph showing the characteristic of electric polarization and the electric field according to the variation of the periodicity of the PZO/PTO artificial lattice.

FIG. 5 is a graph showing the P-E characteristic according to the variation of the deposition periodicity of the PZO/PTO artificial lattice on LSCO/MgO substrate. Referring to FIG. 5, an upper Pt electrode was sputter-deposited in 100 nm thickness on an LSCO-PZO/PTO artificial lattice-LSCO specimen deposited on an MgO substrate, and was subjected to wet etch in ionic water to which 1% nitric and is added for 10 seconds. The Polarization-Electric (P-E) field characteristic was measured by using an RT66A ferroelectric analyzer. The P-E curve was obtained by measuring in the range from −5V to +5V. As shown in the graph, the P-E characteristic shows the form of a hysteresis curve below the critical thickness of the artificial lattice. This means that the artificial lattice shows a ferroelectric characteristic due to the hysteresis characteristic by reversal of electric polarization, and that there was polarization reversal by the applied outer voltage, and that since spontaneous polarization having upward and downward polarization directions at 0V exists, information can be stored according to the polarization direction, which enables non-volatile data storage of retaining data even without an outer power source. As shown in the graph, a different characteristic is represented according to the variation of periodicity. Namely, the electric polarization increases as the period is reduced, and the highest electric polarization is present at the samples of $PZO_1/PTO_1$, and $PZO_2/PTO_2$, which had very short period of deposition. This result shows that the artificial lattice having a very short period of deposition shows anisotropic characteristic structure due to the supercell formed therein, which is newly defined by ordered alignment of predetermined ions in each layer contrary to the conventional multi-layered thin film structure. Oxide artificial lattice, which is fabricated by repeated deposition of a supercell block, represents upward and downward orientations of electric polarization perpendicular to the surface of the thin film, thus it shows reversal of electric polarization in the direction of thin film deposition based on a 180 degrees domain structure. Such a high electric polarization is a very advantageous characteristic for a ferroelectric storage medium for data storage devices.

Figure 6:
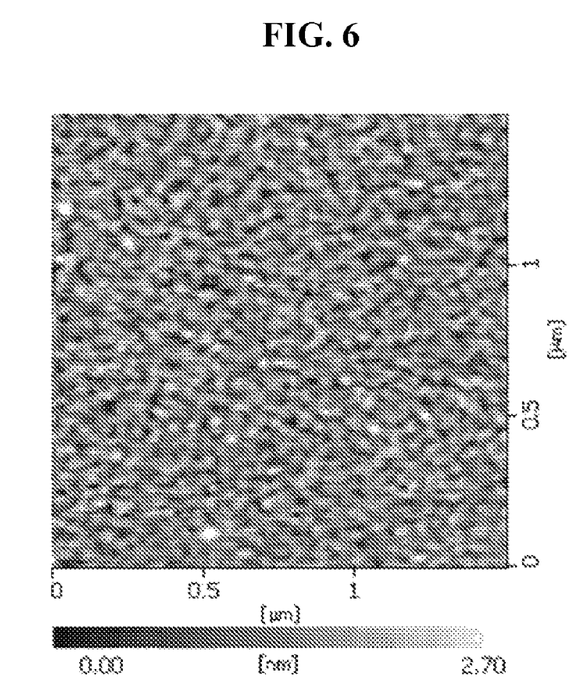
FIG. 6 is a view showing an Atomic Force Microscope (AFM) image of the surface of PZO/PTO artificial lattice having a deposition periodicity of 2 unit cells/2 unit cells.

FIG. 6 is a view showing an Atomic Force Microscope (AFM) image of the surface of the $PZO_2/PTO_2$ artificial lattice. As shown in FIG. 6, surface flatness of the artificial lattice, which was measured in a 1.5 micrometer×1.5 micrometer area with an AFM probe scanning speed of 2 Hz, very advantageously showed about 0.4 nm, which allows the read/write speed to be improved by forming flat surfaces though formation of artificial lattices so as to increase the scan speed of the scanning probe, and which is very advantageous for forming a nano-scaled domain on the surface of the ferroelectric thin film by preventing from of the probe.

Figure 7:
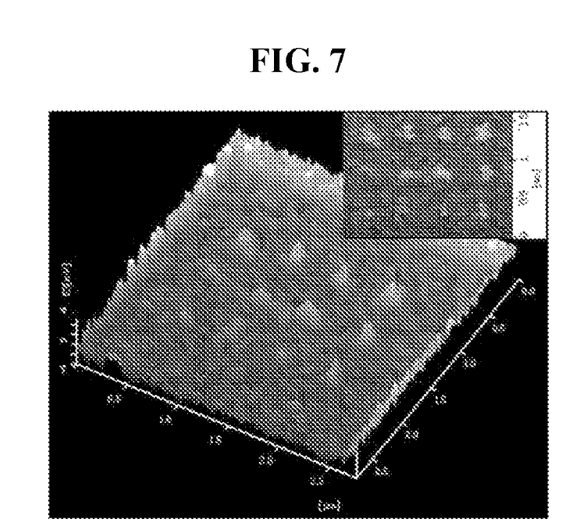
FIG. 7 is a view showing a Scanning Probe Microscope (SPM) image of the surface of $PbZr_{0.5}Ti_{0.5}O_3$ single layer on which domains are formed and data is written and read.
Figure 8:
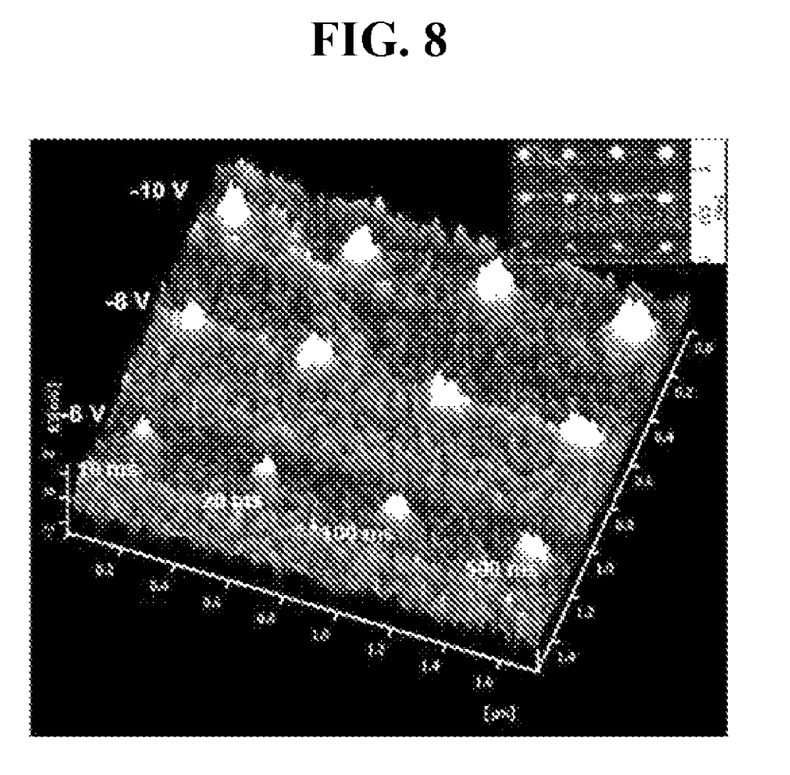
FIG. 8 is a view showing an SPM image of the surface of the PZO/PTO artificial lattice having a deposition periodicity of 2 unit cells/2 unit cells on which domains are formed and a data is written and read.

FIGS. 7 and 8 show domain images inspected by a PFM method, in which flat surfaces of a $PbZr_{0.5}Ti_{0.5}O_3$ (PZT) single layer and a $PZO_2/PTO_2$ artificial lattice were scanned in a 2 micrometer×2 micrometer area by applying +10V outer voltage on a probe so as to align the direction of electrical polarization into one direction, and then changing the outer voltage in the range from −4 V to −10V in a predetermined position simultaneously with reversing the direction of electric polarization, which has already been aligned into one direction, into the opposite direction by changing the voltage application time so as to form a bit. As shown in FIG. 7, for the PZT single layer, there are the difficulties of minimizing the size of the domain because the generation of the domain and the reversal of electric polarization depend on the geometrical shape of crystalline grain in the single layer, and the polarization reversal speed becomes to decrease due to the interaction in the crystalline grain system and read errors can occur due to partial reversal of the domain. On the contrary, concerning the artificial lattice according to one embodiment of the present invention, since domain and polarization reversal has circular form irrespective of the crystalline grain form, the scale of the domain can be easily formed in nano-scale, and because the domain has uniform polarization, the problems of a decrease in polarization reversal speed and read errors due to partial reversal of domain do not occur. This enables high-speed read/write operation and achieves storing capability of high-density data without errors in reading/writing of data, retaining polarization per unit area. This fact is evident from FIG. 8, in which the domain scale of the artificial lattice can be adjusted within the range from 12 nm to 130 nm according to the pulse voltage and time and can be formed in nano scale.

Figure 9:
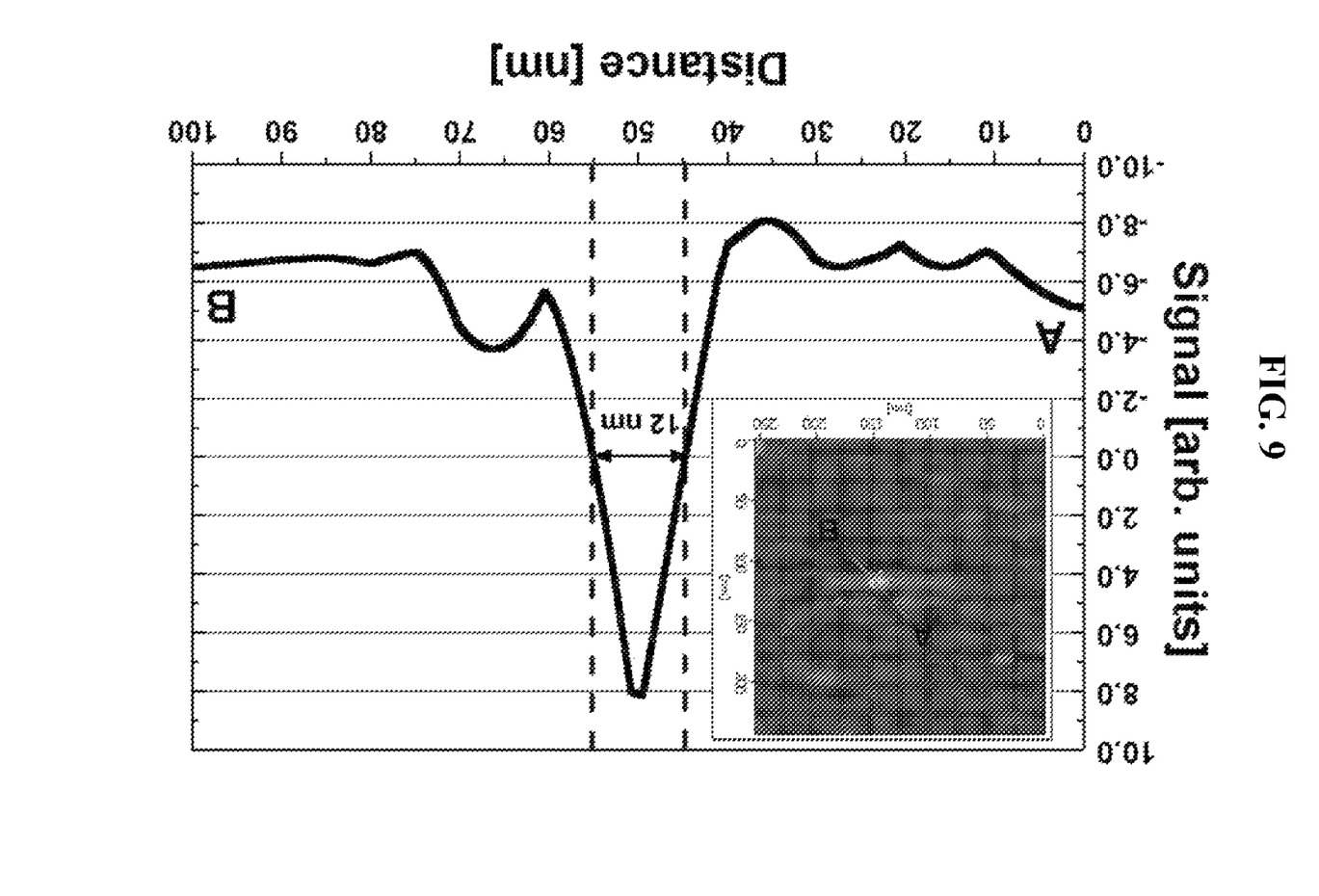
FIG. 9 is a view showing an image in which a minimum 12 nm scaled domain is formed and a profile showing the scale of domain measured along the line of A-B.

FIG. 9 is a view showing an image in which a minimum 12 nm scaled domain formed by applying a −4V outer pulse for 1 ms and a profile in which the scales of domains are measured along the line of A-B. By forming such a nano-scaled domain, data of a few Tbit/inch$^2$ can be stored therein.

As described above, according to one embodiment of the present invention, an LSCO oxide electrode as a lower electrode is formed on a MgO single crystalline substrate by using PLD deposition method, and then the PZO/PTO oxide artificial lattice is deposited. By using XRD analysis, the epitaxial growth, and the crystalline characteristic grown as the above and whether or not an artificial lattice structure was formed were inspected. The ferroelectric characteristic of the artificial lattice was confirmed by using a P-E characteristic curve, and the fact that the artificial lattice has a very flat surface was confirmed by using AFM. By forming a minimum 12 nm scale domain, it was confirmed that the oxide artificial lattice is very suitable as a ferroelectric medium for a data storage device having ultrahigh density of a few Tbit/inch$^2$.

Though the present invention is described referring to the preferred embodiment according to aspects of the present invention, it will be apparent to those skilled in the art that various modifications and variations can be made in the present invention. Thus, it is intended that the present invention covers the modifications and variations of this invention provided they come within the scope of the appended claims and their equivalents.

As describe above, the ferroelectric storage medium for an ultrahigh density data storage device and the method for fabricating the same according to the present invention have the following effects.

According to the present invention, regarding the electric polarization characteristic, the storage medium has single 180 degree domains in the direction of the deposited layers by introducing an oxide artificial lattice for a ferroelectric storage medium. Because the mechanical strain caused by 90 degree domains does not occur, there is no interaction with crystalline grains, thereby allowing the forming of nano-scaled domain and improvement in writing (data storing) nano-scaled bits, hence enabling an ultrahigh density data storage device. Long term retention of domain can be secured thanks to the single 180 degree domain structure, thus it improves reliability of the reading operation for a long period of time and it can be used as a ferroelectric storage medium for ultrahigh density having the data retaining capacity for a long period of time. Also, a flat surface can be formed, thus the process of data reading/writing can be carried out with high speed and abrasion of the probe can be prevented, which enables repeated write operations for a long period of time. Thus, the present invention can be used in a ferroelectric storage medium for an ultrahigh density data storage medium, which can operate at a high speed, retaining the capability of long term retention.

The invention claimed is:

1. A ferroelectric oxide artificial lattice, which is fabricated by sequentially depositing unit lattice layer of at least two or more dielectric materials each having different polarization characteristic thereby forming a unit structure having anisotropic polarization characteristic being different from the constituting dielectric materials, and then by repeatedly stacking the unit structure, wherein the ferroelectric oxide artificial lattice enables nano-scaled domain and long term retention of the domain, wherein the dielectric material is represented by formula 1: $ABO_3$, wherein A is selected from the group consisting of Pb, Ba, Sr, K and Ca, and B is selected from the group consisting of Ti, Zr, Nb, Sn and Fe, provided that B of two or more dielectric materials are not sequentially identical to each other.

2. The ferroelectric oxide artificial lattice according to claim 1, wherein the unit structure has electric polarization being perpendicular to a substrate and being oriented only two directions consisting of upward and downward directions with regard to the substrate, thereby having an associated electric polarization characteristic.

3. The ferroelectric oxide artificial lattice according to claim 2, wherein the unit structure having the electric polarization characteristic, forms sole 180 degree domain structure being perpendicular to the substrate.

4. The ferroelectric oxide artificial lattice according to claim 1, wherein the lattice of the unit structure is provided with a structure, in which atoms of the two or more dielectric materials are orderly aligned.

5. The ferroelectric oxide artificial lattice according to claim 1, wherein a size of the unit lattice of each dielectric material in the unit structure is ranged from 1 unit lattice to 5 unit lattices, and wherein a size of the unit structure is less than 10 unit lattices.

6. The ferroelectric oxide artificial lattice according to claim 1, wherein the dielectric material is any one selected from the group consisting of $PbTiO_3$, $PbZrO_3$, $BaZrO_3$, $SrTiO_3$, $SrZrO_3$, $KNbO_3$, $KTaO_3$, $CaTiO_3$, $CaZrO_3$, $BaSnO_3$, and $BaFeO_3$.

7. A ferroelectric oxide artificial lattice, comprising a unit structure, the unit structure being fabricated by sequentially depositing at least two or more dielectric materials with unit lattice thickness ranging from one unit lattice thickness to a plurality of unit lattice thicknesses, the dielectric materials having polarization characteristic different from each other, wherein the dielectric material is represented by formula 1: $ABO_3$, wherein A is selected from the group consisting of Pb, Ba, Sr, K and Ca, and B is selected from the group consisting of Ti, Zr, Nb, Sn and Fe, provided that B of two or more dielectric materials are not sequentially identical to each other.

* * * * *